(12) United States Patent
Mizuhashi et al.

(10) Patent No.: US 6,278,629 B1
(45) Date of Patent: Aug. 21, 2001

(54) READ-ONLY MEMORY AND METHOD FOR FABRICATING THE SAME

(75) Inventors: Hiroshi Mizuhashi; Teruo Katoh, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/532,041

(22) Filed: Mar. 21, 2000

(30) Foreign Application Priority Data

Sep. 22, 1999 (JP) .................................................. 11-268289

(51) Int. Cl.[7] .................................................... G11C 17/00
(52) U.S. Cl. ........................ 365/104; 257/390; 257/391; 257/392; 257/393; 438/130; 438/275; 365/178
(58) Field of Search ..................................... 438/130, 237, 438/275, 278, 282, 257; 257/390, 391, 392, 393, 206, 208; 365/145, 218, 104, 178

(56) References Cited

U.S. PATENT DOCUMENTS

| 4,298,962 | * | 11/1981 | Hamano et al. | 365/182 |
| 4,333,164 | * | 6/1982 | Orikabe et al. | 365/104 |
| 5,149,667 | * | 9/1992 | Choi . | |
| 5,345,414 | * | 9/1994 | Nakamura | 365/145 |
| 5,851,884 | * | 12/1998 | Wen | 438/275 |
| 5,937,280 | * | 8/1999 | Wen | 438/130 |

* cited by examiner

Primary Examiner—Matthew Smith
Assistant Examiner—V. Yevsikov
(74) Attorney, Agent, or Firm—Jones Volentines, PLLC

(57) ABSTRACT

A read-only memory includes a semiconductor substrate; a memory cell matrix which is formed on the semiconductor substrate; and word and bit lines which define the locations of the memory cell matrix. The memory cell matrix includes field effect transistors, each of which turns off when accessed or addressed; and conducting regions, which keep conductive state all the time. Binary data stored in the memory cell matrix are determined by detecting current flowing through the selected bit line.

24 Claims, 4 Drawing Sheets

READ-ONLY MEMORY AND METHOD FOR FABRICATING THE SAME

CROSS REFERENCE TO RELATED APPLICATION

This application claims the priority of Application No. H11-268289, filed Sep. 22, 1999 in Japan, the subject matter of which is incorporated herein by reference.

1. Technical Field of the Invention

The present invention relates to a read-only memory (ROM) such as a mask ROM; and especially to ROM employing NAND type memory cell structure.

2. Background of the Invention

A conventional mask ROM includes a memory cell matrix provided on a semiconductor substrate, the memory cell matrix being of MOS transistors. In accordance with the type of binary data stored therein, enhancement type transistors (EMOS) and depression type transistors (DMOS) are selectively formed on the semiconductor substrate. When the MOS transistor is of N-type, EMOS and DMOS have threshold values of positive and negative, respectively.

In a ROM with NAND type memory cell structure, when a memory cell line extending along a bit line is selected and a MOS transistor corresponding to a word line is selected, non selected word lines keep positive in electric potential. The MOS transistors connected to such non selected word lines are in a closed condition, regardless of type of the transistor, enhancement type or depression type.

On the other hand, the selected word lines are in zero voltage condition. When the MOS transistor connected to one of the selected word lines is of enhancement type, the MOS transistor turns on or opened. When the MOS transistor connected to one of the selected word lines is of depression type, the MOS transistor turns off or closed. In other words, when the selected MOS transistor is of enhancement type, no electrical current flows through the corresponding bit line. When the selected MOS transistor is of depression type, electrical current flows through the corresponding bit line.

It can be determined whether the selected (or addressed) transistor is DMOS or EMOS by detecting the current flowing through the corresponding bit line. In other words, it can be determined whether the selected memory cell stores "1" or "0".

According to such a mask ROM, binary data are written to the memory cell matrix by ion implantation process, after the fabrication of the MOS transistors are completed. For example, enhancement type of transistors are firs formed for all the memory cell regions, and then some memory cells are changed to depression type by ion implantation process. Therefore, the fabrication steps of the ROM become complicated. Since the ion implantation process is carried out after the MOS transistor fabrication is completed, the ion implantation process may affect to other circuits on the same semiconductor substrate. In some cases, the circuit design of the ROM must be changed fundamentally to avoid the affection of the ion implantation.

OBJECTS OF THE INVENTION

Accordingly, an object of the present invention is to provide a read-only memory which can be fabricated without impurity implantation after the fabrication of transistors are completed.

Another object of the present invention is to provide a method for fabricating a read-only memory in which no impurity implantation is carried out after the fabrication of transistors are completed.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a read-only memory includes a semiconductor substrate; a memory cell matrix which is formed on the semiconductor substrate; and word and bit lines which define the locations of the memory cell matrix. The memory cell matrix includes field effect transistors, each of which turns off when accessed or addressed; and conducting regions which keep conductive state all the time. Binary data stored in the memory cell matrix are determined by detecting current flowing through the selected bit line.

The conducting regions always keep a closed or conducting condition regardless of selected or non-selected as the same as depression type MOS transistors. Therefore, when one of the field effect transistors is selected or addressed, the corresponding bit line is opened or disconnected. On the other hand, when one of the conducting regions is selected or addressed, the corresponding bit line is closed or connected. It can be determined whether the selected (or addressed) transistor is field effect transistor or conducting region by detecting the current flowing through the corresponding bit line. In other words, it can be determined whether the selected memory cell stores "1" or "0".

The conducting regions are provided instead of depression type of MOS transistors in a conventional ROM. The conducting regions may be formed by thermal diffusion of impurities or impurity implantation process, which can be carried out simultaneously with forming source and drain of the field effect transistors. As a result, it is unnecessary to carry out an ion implantation process just for writing binary data in the memory cell matrix.

According to the present invention, no ion implantation process is carried out just for writing binary data into a memory cell matrix, so that the fabrication steps can be simplified, and thereby costs for fabricating read-only memories can be decreased. Because no ion implantation process is carried out after the MOS transistor fabrication is completed, the ion implantation process does not affect to other circuits on the same semiconductor substrate. Therefore, the circuitry of the ROM can be designed with more degree of freedom as compared to the conventional technology.

The read-only memory according to the present invention may be a NAND type mask ROM.

The read-only memory according to the present invention may further includes a current regulating circuit provided within each of memory cell lines corresponding to the bit lines to regulate the amount of electrical current flowing through the memory cell line. The degree of regulation by the current regulating circuit is determined in accordance with the number of the conducting regions provided in the corresponding memory cell line.

The conducting regions have lower resistance relative to the field effect transistors. The more current flows through a bit line in which the more conducting regions are formed in the corresponding memory cell line. Electric current flowing through a selected bit line is converted to the corresponding voltage and detected. When such a voltage increases, detecting time for comparing with a reference voltage increases as well; and therefore, the access time becomes longer. The current regulating circuit prevents increasing of the bit line current, which undesirably changes the access time of the ROM. Electric current flowing through the bit line is uniformed, and therefore, the access time of the ROM may be shortened.

The current regulating circuits may be switching elements formed from field effect transistors, each of which is formed between the corresponding memory cell line and bit line.

The switching element may be designed to have an optimum gate length that is defined in response to the number of the conducting region(s) formed within the corresponding memory cell line. Such a switching element may be designed to have a longer gate length when a large number of conducting regions are formed with in the corresponding memory cell line. According to the switching elements, irregular of current flowing through the bit lines is prevented.

The switching elements may be designed to have an optimum gate width that is defined in response to the number of the conducting region(s) formed within the corresponding memory cell line. Such a switching element may be designed to have a narrower gate width when a large number of conducting regions are formed with in the corresponding memory cell line.

The field effect transistors, forming the memory cell matrix, may be enhancement type field effect transistors, in which sources and drains are formed by an impurity implantation process to the semiconductor substrate. The conducting regions may be formed by an impurity implantation process to specific regions in the semiconductor substrate at the same time when the sources and drains of the field effect transistors are formed. The impurity implantation may be performed by a well-know ion implantation method.

The ion implantation process may include the steps of:

forming a gate layer over memory cell regions for the conducting regions, the gate layer being also used to form gates of the enhancement type field effect transistors; selectively removing the gate layer at specific areas comprising areas for the conducting regions but except areas for the gates to form the gates; and selectively implanting ions into the semiconductor substrate using the gates as a mask.

The read-only memory is fabricated by a method may further include the steps of: forming an insulating layer on the remaining gates; forming contact holes passing through the insulating layer; providing a wiring pattern connected to the word lines; and connecting the gates to the word lines via the contact holes and wiring pattern.

According to a second aspect of the present invention a method for fabricating a read-only memory includes the steps of:

providing a semiconductor substrate; forming active regions extending in a first direction to define memory cell lines along bit lines; forming a gate oxide layer on the active regions; forming a gate layer on the gate oxide layer; removing a part of the gate layer except areas for gates of field effect transistors, which store one type of binary data; forming impurity regions at both sides of each gate of the field effect transistor to form source and drain thereof; implanting impurities in the semiconductor substrate using the gate as a mask to form conducting regions, which store the other type of binary data therein; forming an insulating layer over the gates of the field effect transistors; forming contact holes passing through the interlayer insulating layer; and forming a wiring pattern which is connected to the gates via the contact holes and to word lines, which are extending in a second direction orthogonal to the first direction. The word and bit lines define the locations of the memory cell matrix. Binary data stored in the memory cell matrix are decided by detecting current flowing through the corresponding bit line.

According to the method, conducting regions are formed at the same time when sources and drains of field effect transistors are formed. Therefore, a read-only memory of the present invention can be fabricated efficiently.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

<First Embodiment>

Figure 1:
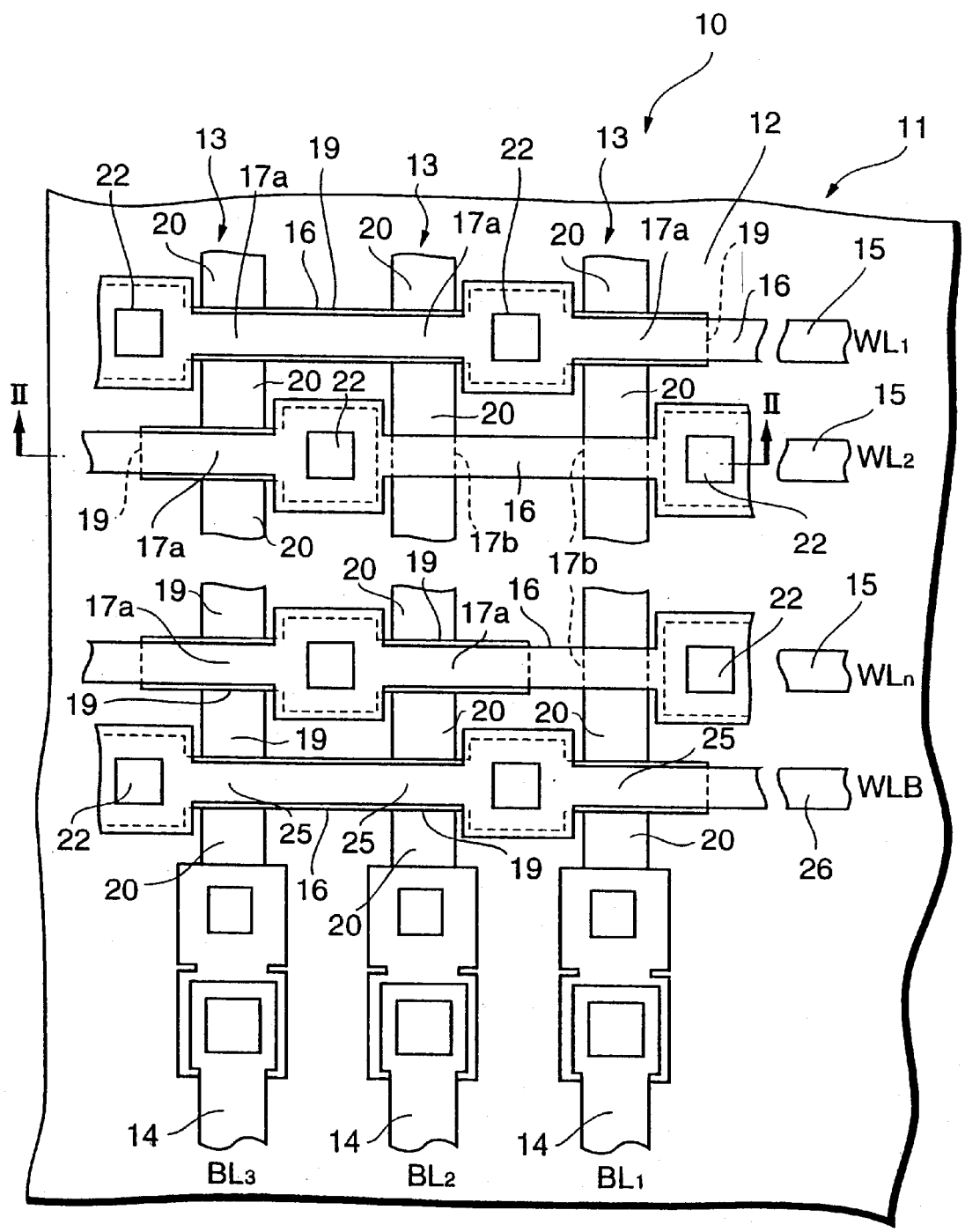
FIG. 1 is a plan view showing a read-only memory according to an embodiment of the present invention.
Figure 2:
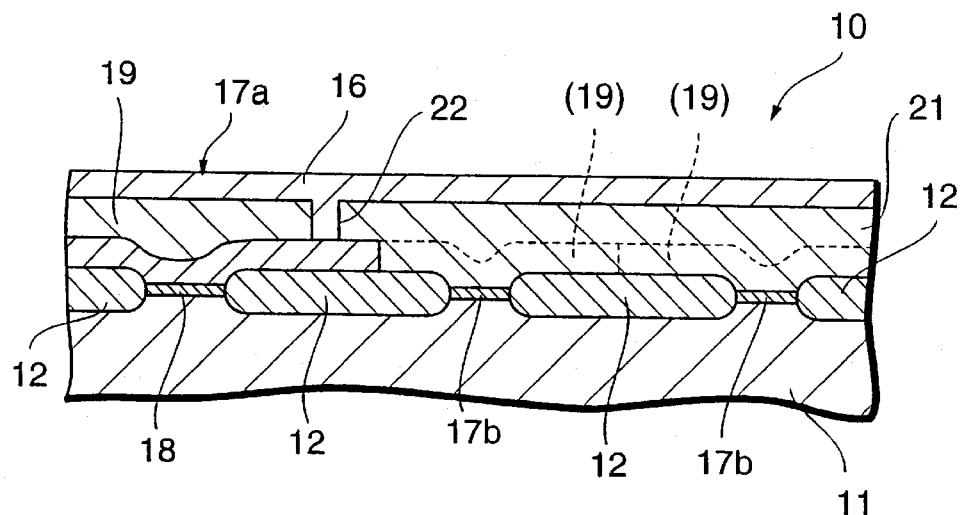
FIG. 2 is a cross-sectional view taken on line II—II in FIG. 1.
Figure 3:
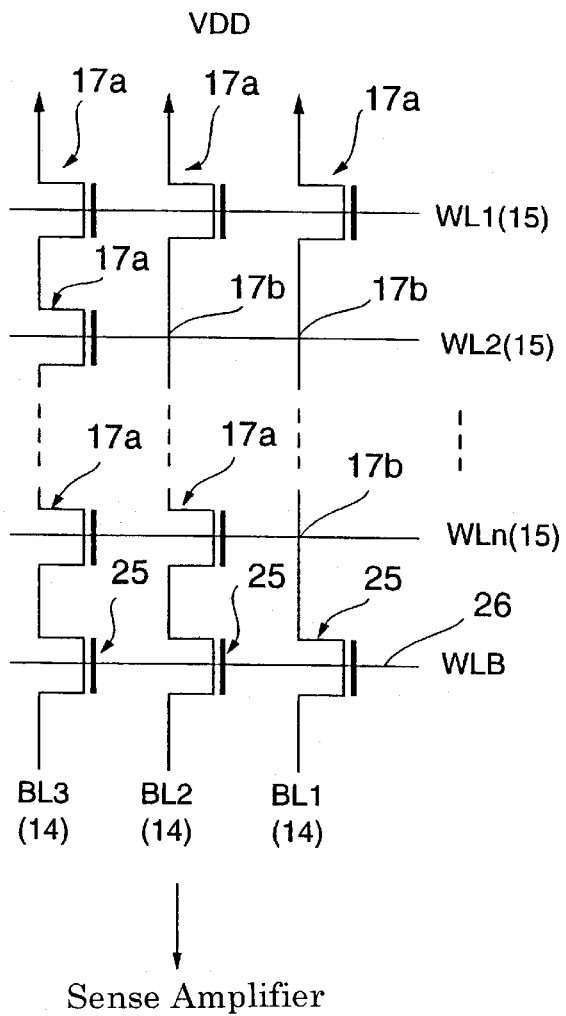
FIG. 3 is an equivalent circuit of the read-only memory, shown in FIG. 1.

FIGS. 1 to 3 show a NAND type of mask ROM according to a first preferred embodiment of the present invention. FIG. 1 is a plan view showing a part of the mask ROM; FIG. 2 is a cross-sectional view taken on line II—II in FIG. 1; and FIG. 3 is an equivalent circuit of the mask ROM.

As shown in FIGS. 1 and 2, a mask ROM 10 includes a semiconductor substrate 11 of p-type silicon semiconductor. The semiconductor substrate 11 is provided thereon with device isolation regions 12, which are formed from an oxide layer by a well-known LOCOS technique. The device isolation regions 12 define or isolate active regions 13 extending in parallel to each other. The active regions 13 correspond to bit lines 14 (BL1, BL2, BL3, . . . ) one by one. Wiring lines (patterns) 16 are formed on the active regions 13. The wiring lines 16 are formed on extended portions of word lines 15, which extend orthogonal to the bit lines 14 and active regions 13.

The mask ROM 10 also includes first and second memory cells 17a and 17b, which are provided at intersections between active regions 13 and wiring lines 16. The active regions 13 are formed on extended portions of the bit lines 14.

The first memory cells 17a are enhancement type of MOS transistors (EMOS), having positive threshold values. Each of the EMOS transistors 17a includes a gate 19 and a pair of impurity regions 20 for source and drain. The gates 19 are formed on the active regions 13 with a gate oxide layer 18, as shown in FIG. 2. The EMOS transistors 17a keep the source-drain connection being in a disconnected or open condition, when a voltage lower than the threshold value is applied to the gate 19. On the other hand, the EMOS transistors 17a keep the source-drain connection being in a connected or closed condition, when a voltage higher than the threshold value is applied to the gate 19.

The first memory cells 17a are connected at gates 19 to the wiring lines 16 by contacts (contact holes) 22, which are passing through an insulating layer 21. The wiring lines 16 are formed on the insulating layer 21, not shown in FIG. 1. In other words, the EMOS transistors 17a are connected at the gates 19 to the corresponding word lines 15 via the wiring lines 16.

The second memory cells 17b are formed by conducting regions (17b), extending along the active regions 13. Each of the conducting regions 17b is formed as one united body with a pair of the impurities 20, which are formed originally for source-drain of the first memory cells 17a. There is no gate (19) formed on the conducting regions 17b, as shown in FIG. 2. The insulating layer 21 is formed between the conducting regions 17b and wiring lines 16 so as to prevent a short circuit between two layers 17b and 16.

The first and second memory cells 17a and 17b are formed at predetermined locations in accordance with the ROM design of binary data "0" and "1", respectively.

The mask ROM 10 further includes selecting MOS transistors 25, selecting or addressing one memory cell line (memory cell block) 17a and 17b corresponding to selected bit lines 14 (BL1–BL3). Each of the selecting MOS transistors 25 is arranged between one of the bit lines 14 and one end of the corresponding active region 13. The active regions 13 are applied at the other ends with power supply voltage VDD, as shown in FIG. 3.

The selecting MOS transistors 25 are EMOS transistors as the same as the first memory cells 17a. Each of the selecting MOS transistors 25 allows the corresponding bit line 14 and memory cell line (17) to be in conductive condition, when a positive selecting voltage is applied to the corresponding block selecting line (word line) 26. As a result, the memory cells 17a and 17b in the selected memory cell line are electrically connected to the corresponding bit line 14.

FIG. 3 is an equivalent circuit of the mask ROM, clearly showing the relation among the bit lines 14, memory cell lines 17 and word lines 15. When a positive voltage signal is supplied to a block selection line 26 (WLB), each selecting MOS transistor 25 turns on (connected), the memory cell lines 17 for the selected memory block are connected to the corresponding bit lines 14. Each of the bit lines 14 is provided with a sense amplifier, which detects current flowing through the corresponding bit line 14 as voltage.

The reading operation from the mask ROM 10 is carried out as follows: In the reading operation, it is discriminated whether the first and second memory cells 17a and 17b store which binary data "0" or "1".

As described above, when the block selection line 26 (WLB) is selected, each selecting MOS transistor 25 turns on (connected). When the MOS transistors 25 turn on, the corresponding memory block composed of the memory cell lines 17 is selected. According to a negative logic, the selected word lines 15 are applied with a negative voltage, while non-selected word lines 15 keep its positive voltage state.

As a result, the EMOS transistors 17a connected to the non-selected word lines 15 turn on. The second memory cells (conducting regions) 17b keep its conductive state regardless of the state of corresponding word lines 15. On the other hand, the EMOS transistors 17a connected to the selected word lines 15 turn off or keep its non-conductive state.

Consequently, in the memory cell line 17 connected to selected word line 15 and bit line 14, non-selected memory cells 17 are in conductive state.

When the EMOS transistors 17a are selected or addressed, the memory cells 17a are in the non-conductive state. When the conducting regions 17b are selected or addressed, the memory cells 17b are in the conductive state. The memory cell line (17) corresponding to a selected bit line 14 has conductive or non-conductive state that changes depends on whether the selected memory cells are the EMOS transistors 17a or conducting regions 17b. When an EMOS transistor 17a is addressed to read, no current flows through the corresponding bit line 14. When a conducting region 17b is addressed to read, current flows through the corresponding bit line 14.

The current flowing through the bit line 14 is detected as a voltage by the sense amplifier (not shown). Therefore, the addressed memory cell 17 is discriminated whether the memory cell is EMOS transistor 17a or conducting region 17b by detecting a voltage applied to the selected bit line 14. In other words, the addressed memory cell 17 is discriminated whether the memory cell stores "0" or "1" therein.

Figure 4:
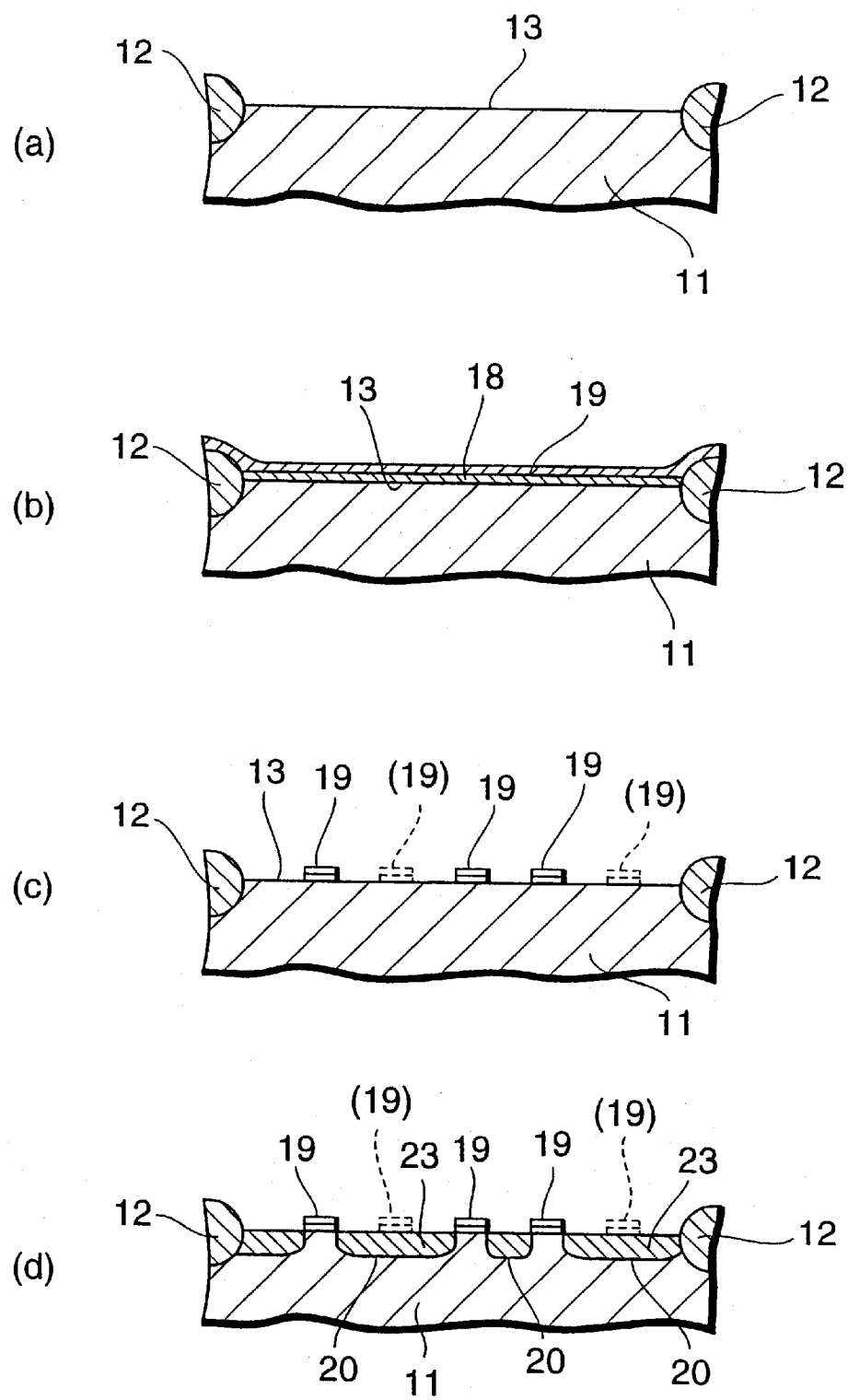
FIG. 4 includes drawings (a) to (d) showing fabrication steps of the read-only memory, shown in FIG. 1.

Next, the fabricating steps of the mask ROM 10 are described in conjunction with FIG. 4. As shown in FIG. 4(A), device-isolation regions 12, which are formed from a filed oxide layer by a well-known LOCOS technique, are formed on a semiconductor substrate 11, which may be of p-type silicon semiconductor. The device isolation regions 12 define or segment active regions 13 extending in parallel to each other. In FIG. 4, only one of the active regions 13 is shown for easy understanding.

As shown in FIG. 4(b), an oxide layer 18 is formed over the active region 13 by a thermal oxidation process to the surface of the semiconductor substrate 11. A gate layer 19 is formed on a gate oxide layer (18), corresponding to the oxide layer 18. The gate layer 19 is made of polysilicon to which impurities, such as phosphorus, are added.

As shown in FIG. 4(c), the gate layer (19) and gate oxide layer (18) are removed from specific areas including areas for second memory cells 17b but except areas for gates of first memory cells 17a.

In FIG. 4(c), gates 19 that are not removed for conventional mask ROM are shown by broken lines and are removed for the mask ROM 10 according to the present invention. The gate layer 19 and gate oxide layer 18 are removed by a well-know photolithography etching process.

Impurities, such as As (arsenic), are implanted into the active region 13 by an ion implantation method using the remaining gates 19 as a mask. The implanted impurities are activated by a thermal treatment to form impurity regions 20 at both sides of each gate 19, as shown in FIG. 4(d). At the same time, conductive regions 17b are formed in one united body with the source-drain regions 20 of the EMOS transistors 17a.

After the source-drain regions 20 and conducting regions 17b are formed, an insulating layer 21 is formed over those regions 20 and 17b, as shown in FIG. 2. Next, contact holes of contacts 22 are formed through the insulating layer 21. A wiring layer is formed over the insulating layer 21 and in the contact holes. After that, useless regions of the wiring layer are removed by a well-know photolithography etching process in order to form a wiring pattern 16, which is connected to word lines 15. Another insulating layer (not shown) is formed on the wiring pattern 16, and bit lines 14 are formed on the insulating layer. The bits line 14 are connected to the active regions 13.

According to the present invention, the conducting regions 17b can be formed at the same time when the impurity regions 20 for source-drain of the EMOS transistors 17a are formed.

According to the present invention, no ion implantation process is carried out just for writing binary data into a memory cell matrix, so that the fabrication steps can be simplified, and thereby costs for fabricating read-only memories can be decreased. Because no ion implantation process is carried out after the MOS transistor fabrication is completed, the ion implantation process does not affect to other circuits on the same semiconductor substrate. Therefore, the circuitry of the ROM can be designed with more degree of freedom as compared to the conventional technology.

The conducting regions 17b can be formed by a thermal diffusion method instead of ion implantation method. Preferably, ion implantation method is employed, because the conducting regions 17b can be formed more easily.

Figure 5:
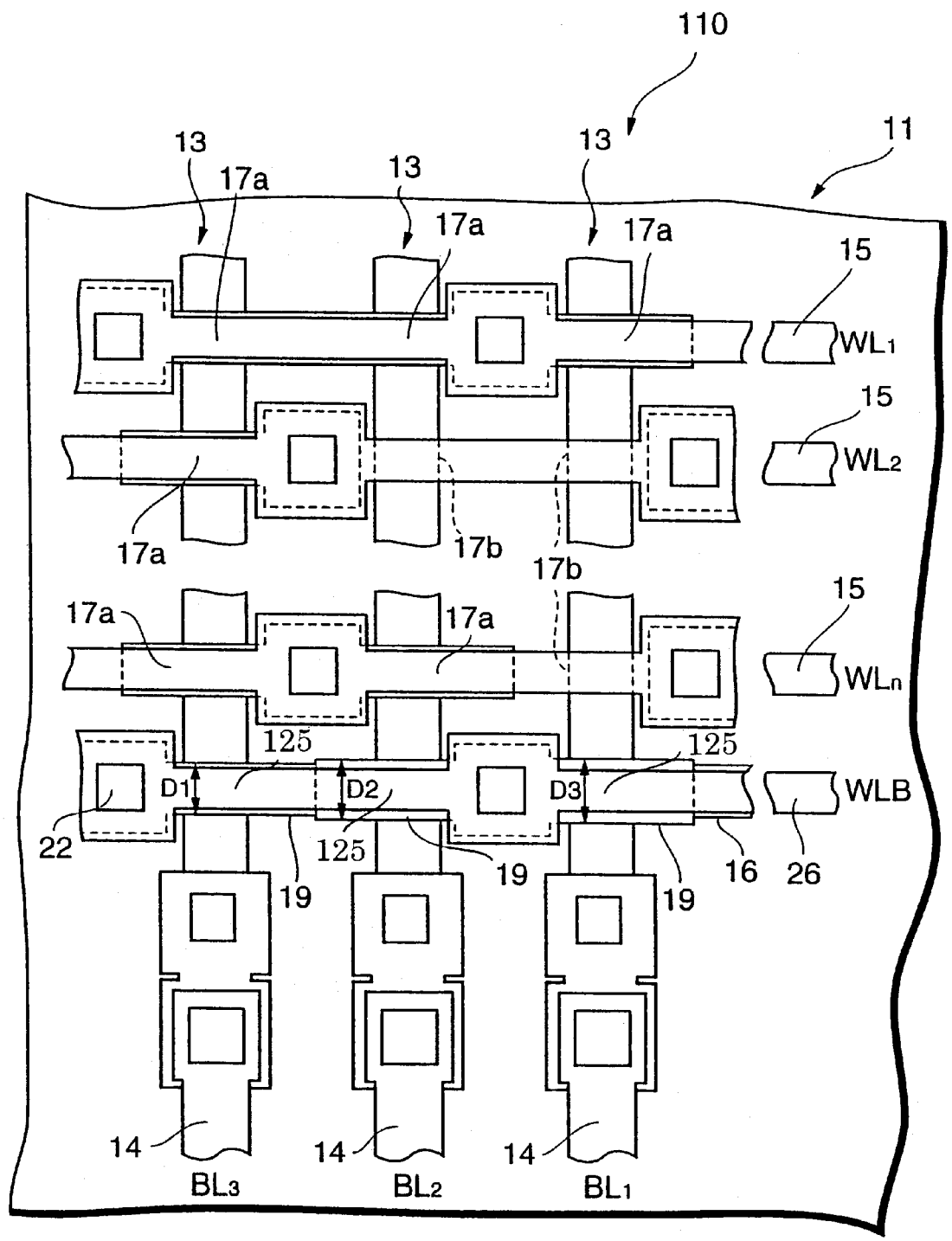
FIG. 5 is a plan view showing a read-only memory according to another embodiment of the present invention.

FIG. 5 is a plan view showing a mask ROM 110 according to another embodiment of the present invention. In this embodiment, the same or corresponding elements to the other embodiment, shown in 1, are represented by the same reference numerals and the same description is not repeated. The mask ROM 110 is designed in the same manner as the mask ROM 10, shown in FIG. 1, except the selecting MOS transistors 25.

When binary data stored in the mask ROM 110 are read, current flowing through bit lines 14 is detected as a voltage, in the same manner as the mask ROM 10. The same number of memory cells are provided for each bit line 14. However, conducting regions 17b have lower resistance relative to EMOS transistors 17a in a conductive state (on state). The more current flows through a bit line in which the more conducting regions 17b are formed in the corresponding memory cell line.

Electric current flowing through a selected bit line 14 is converted to the corresponding voltage and detected by a sense amplifier. When such a voltage increases, detecting time by the sense amplifier increases; and therefore, the access time becomes longer. In order to prevent increasing or variation of the bit line current, which undesirably changes the access time of the ROM, the mask ROM 110 includes a current regulating circuit (125). The current regulating circuit (125) allows electric current flowing through the bit line to be uniformed, and therefore, the access time of the mask ROM 110 may be shortened.

The current regulating circuit (125) includes a plurality of selecting MOS transistors 125. Each of the selecting MOS transistors 125 is designed to have an optimum gate width D (D1–D3), which is determined in accordance with how many conducting regions 17b are provided in the corresponding bit line 14 (BL1–BL3).

In FIG. 5, there is no conducting region 17b is provided in the memory cell line 17 corresponding to the bit line 14 (BL1), but all the memory cells are EMOS transistors 17a. The selecting MOS transistor 125 in the bit line 14 (BL1) is designed to have a gate length D1, which is relatively short. One conducting region 17b is provided in the memory cell line 17 corresponding to the bit line 14 (BL2), and the other memory cells are of EMOS transistors 17a. The selecting MOS transistor 125 in the bit line 14 (BL2) is designed to have a gate length D2, which is longer than D1. Two conducting regions 17b are provided in the memory cell line 17 corresponding to the bit line 14 (BL3), and the other memory cells are of EMOS transistors 17a. The selecting MOS transistor 125 in the bit line 14 (BL3) is designed to have a gate length D3, which is longer than D2.

The selecting MOS transistors 125 may be called switching elements, each of which is formed between the corresponding memory cell 17 line and bit line 14.

The selecting MOS transistors 125 are designed to have an optimum gate length that is defined in response to the number of the conducting region(s) 17b formed within the corresponding memory cell line 14. Such a selecting MOS transistor is designed to have a longer gate length (D3) when a large number of conducting regions 17b are formed within the corresponding memory cell line 14.

According to the selecting MOS transistors 125, irregular of current flowing through the bit lines 14 is prevented. The current regulating circuit (125) prevents increasing of the bit line current, which undesirably changes the access time of the mask ROM 110. Electric current flowing through the bit line 14 is uniformed, and therefore, the access time of the mask ROM 110 may be shortened.

In alternation, each of the selecting MOS transistors 125 may be designed to have an optimum gate width that is defined in response to the number of the conducting region (s) 17b formed within the corresponding memory cell line 14. Such a selecting MOS transistor may be designed to have a narrower gate width when a large number of conducting regions 17 are formed with in the corresponding memory cell line 14. According to the selecting MOS transistors 125, irregular of current flowing through the bit lines 14 is prevented. The current regulating circuit (125) prevents increasing of the bit line current, which undesirably changes the access time of the mask ROM 110. Electric current flowing through the bit line 14 is uniformed, and therefore, the access time of the mask ROM 110 may be shortened.

In general, the gate length D of a selecting MOS transistor can be changed easily by changing a patterning mask for an etching process. On the other hand, for changing the gate width of a selecting MOS transistor, it is necessary to change the width of the active region 13. For that reason, it is preferable that the gate length D of selecting MOS transistors 125 are changed to control the amount of current flowing through the bit lines 14.

The amount of current flowing through the memory cell lines 17 (bit lines 14) can be controlled by regulating the width of each active region 13. Other ways can be applied as a current regulating circuit (125) to the present invention.

In the above described embodiments, the mask ROM (10, 110) includes n-type of EMOS transistors 17a and conducting regions 17b, formed by an impurity implantation. However, p-type of EMOS transistors can be used instead. Other types of field effect transistors also applicable. Further, the present invention is applicable to other types of read-only memory.

According to a read-only memory of the present invention, conducting regions 17b are provided instead of depression type of MOS transistors in a conventional ROM. As a result, it is unnecessary to carry out an ion implantation process just for writing binary data in the memory cell matrix; and therefore, costs for fabricating read-only memories can be decreased. Further no ion implantation process is carried out after the MOS transistor fabrication is completed, so that the ion implantation process does not affect to other circuits on the same semiconductor substrate. Therefore, the circuitry of the ROM can be designed with more degree of freedom as compared to the conventional technology.

According to a method of the present invention, conducting regions are formed at the same time when sources and drains of field effect transistors are formed. Therefore, a read-only memory of the present invention can be fabricated efficiently.

What is claimed is:

1. A read-only memory, comprising:
   a semiconductor substrate;
   a memory cell matrix which is formed on the semiconductor substrate; and
   word and bit lines which define the locations of the memory cell matrix, wherein
   the memory cell matrix comprises field effect transistors, each of which turns off when accessed or addressed; and conducting regions which keep conductive state all the time; and
   binary data stored in the memory cell matrix are determined by detecting current flowing through the corresponding bit line.

2. A read-only memory according to claim 1, wherein the read-only memory is a NAND type mask ROM.

3. A read-only memory according to claim 1, further comprising:
   a memory cell line corresponding to each bit line wherein said memory cell line represents a current regulating circuit regulating the amount of electrical current flowing through the memory cell line, wherein
   degree of regulation by the current regulating circuit is determined in accordance with the number of the conducting regions provided in the corresponding memory cell line.

4. A read-only memory according to claim 3, wherein the current regulating circuits are switching elements formed from field effect transistors, each of which is formed between the corresponding memory cell line and bit line.

5. A read-only memory according to claim 4, wherein each of the switching elements is designed to have an optimum gate length that is defined in response to the number of the conducting region(s) formed within the corresponding memory cell line.

6. A read-only memory according to claim 4, wherein each of the switching elements is designed to have an optimum gate width that is defined in response to the number of the conducting region(s) formed within the corresponding memory cell line.

7. A read-only memory according to claim 1, wherein the field effect transistors, forming the memory cell matrix, are enhancement type field effect transistors, in which sources and drains are formed by an impurity implantation process to the semiconductor substrate; and
   the conducting regions are formed by an impurity implantation process to specific regions in the semiconductor substrate at the same time when the sources and drains of the field effect transistors are formed.

8. A read-only memory according to claim 7, wherein the read-only memory is a NAND type mask ROM.

9. A read-only memory according to claim 7, further comprising:
   a memory cell line corresponding to each bit line wherein said memory cell line represents a current regulating circuit regulating the amount of electrical current flowing through the memory cell line, wherein
   degree of regulation by the current regulating circuit is determined in accordance with the number of the conducting regions provided in the corresponding memory cell line.

10. A read-only memory according to claim 9, wherein the current regulating circuits are switching elements formed from field effect transistors, each of which is formed between the corresponding memory cell line and bit line.

11. A read-only memory according to claim 10, wherein each of the switching elements is designed to have an optimum gate length that is defined in response to the number of the conducting region(s) formed within the corresponding memory cell line.

12. A read-only memory according to claim 10, wherein each of the switching elements is designed to have an optimum gate width that is defined in response to the number of the conducting region(s) formed within the corresponding memory cell line.

13. A read-only memory according to claim 7, wherein the impurity implantation is carried out by an ion implantation process.

14. A read-only memory according to claim 13, wherein the ion implantation process comprises the steps of:
    forming a gate layer over memory cell regions for the conducting regions, the gate layer being also used to form gates of the enhancement type field effect transistors;
    selectively removing the gate layer at specific areas comprising areas for the conducting regions but except areas for the gates to form the gates; and
    selectively implanting ions into the semiconductor substrate using the gates as a mask.

15. A read-only memory according to claim 14, wherein the read-only memory is fabricated by a method further comprising the steps of:
    forming an insulating layer on the remaining gates;
    forming contact holes passing through the insulating layer;
    providing a wiring pattern connected to the word lines; and
    connecting the gates to the word lines via the contact holes and wiring pattern.

16. A mask ROM, comprising:
    a semiconductor substrate;
    a memory cell matrix which is formed on the semiconductor substrate; and is comprised of field effect transistors, each of which turns off when accessed or addressed, and conducting regions which keep conductive state all the time; and
    word and bit lines which define the locations of the memory cell matrix, wherein
    the field effect transistors, forming the memory cell matrix, are enhancement type field effect transistors, in which sources and drains are formed by an ion implantation process to the semiconductor substrate;
    the conducting regions are formed by an ion implantation process to specific regions in the semiconductor substrate at the same time when the sources and drains of the field effect transistors are formed; and
    binary data stored in the memory cell matrix are determined by detecting current flowing through the corresponding bit line.

17. A mask ROM according to claim 16, wherein the ion implantation process comprises the steps of:
  forming a gate layer over memory cell regions for the conducting regions, the gate layer being also used to form gates of the enhancement type field effect transistors;
  selectively removing the gate layer at areas comprising areas for the conducting regions but except areas for the gates to form the gates; and
  selectively implanting ions into the semiconductor substrate using the gates as a mask.

18. A mask ROM according to claim 17, wherein the mask ROM is fabricated by a method further comprising the steps of:
  forming an insulating layer on the remaining gates;
  forming contact holes passing through the insulating layer;
  providing a wiring pattern connected to the word lines; and
  connecting the gates to the word lines via the contact holes and wiring pattern.

19. A mask ROM according to claim 16, further comprising:
  a memory cell line corresponding to each bit line wherein said memory cell line represents a current regulating circuit regulating the amount of electrical current flowing through the memory cell line, wherein
  degree of regulation by the current regulating circuit is determined in accordance with the number of the conducting regions provided in the corresponding memory cell line.

20. A mask ROM according to claim 19, wherein the current regulating circuits are switching elements formed from field effect transistors, each of which is formed between the corresponding memory cell line and bit line.

21. A mask ROM according to claim 20, wherein each of the switching elements is designed to have an optimum gate length that is defined in response to the number of the conducting region(s) formed within the corresponding memory cell line.

22. A mask ROM according to claim 20, wherein each of the switching elements is designed to have an optimum gate width that is defined in response to the number of the conducting region(s) formed within the corresponding memory cell line.

23. A mask ROM according to claim 19, wherein the ion implantation process comprises the steps of:
  forming a gate layer over memory cell regions for the conducting regions, the gate layer being used to form gates of the enhancement type field effect transistors;
  selectively removing the gate layer at areas comprising areas for the conducting regions but except areas for the gates; and
  selectively implanting ions into the semiconductor substrate using the gates as a mask.

24. A mask ROM according to claim 23, wherein the mask ROM is fabricated by a method further comprising the steps of:
  forming an insulating layer on the remaining gates;
  forming contact holes passing through the insulating layer;
  providing a wiring pattern connected to the word lines; and
  connecting the gates to the word lines via the contact holes and wiring pattern.

* * * * *